United States Patent
Tsuchiya et al.

(10) Patent No.: US 9,130,140 B2
(45) Date of Patent: Sep. 8, 2015

(54) LIGHT-EMITTING DEVICE INCLUDING A HEAT DISSIPATION HOLE

(71) Applicant: TOYODA GOSEI CO., LTD., Kiyosu-shi (JP)

(72) Inventors: Yosuke Tsuchiya, Kiyosu (JP); Hiroyuki Tajima, Kiyosu (JP); Shota Shimonishi, Kiyosu (JP); Akira Sengoku, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/175,772

(22) Filed: Feb. 7, 2014

(65) Prior Publication Data

US 2014/0284651 A1    Sep. 25, 2014

(30) Foreign Application Priority Data

Mar. 25, 2013 (JP) .................................. 2013-062488

(51) Int. Cl.
| | |
|---|---|
| *H01L 33/64* | (2010.01) |
| *H01L 33/62* | (2010.01) |
| *H01L 33/50* | (2010.01) |
| H01L 25/075 | (2006.01) |

(52) U.S. Cl.
CPC .............. *H01L 33/641* (2013.01); *H01L 33/50* (2013.01); *H01L 25/0753* (2013.01); *H01L 33/62* (2013.01); *H01L 2224/48091* (2013.01); *H01L 2224/48137* (2013.01)

(58) Field of Classification Search
CPC ........... H01L 2224/48227; H01L 2224/48091; H01L 2933/0091; H01L 33/60; H01L 33/486; H01L 2224/16225
USPC ......................................... 257/98, 99; 438/27
See application file for complete search history.

(56) References Cited

U.S. PATENT DOCUMENTS

| | | | |
|---|---|---|---|
| 2008/0074029 A1* | 3/2008 | Suehiro | 313/487 |
| 2010/0320483 A1* | 12/2010 | Kadotani et al. | 257/88 |
| 2011/0140144 A1* | 6/2011 | Lim et al. | 257/98 |
| 2013/0256854 A1* | 10/2013 | Kobayashi et al. | 257/675 |

FOREIGN PATENT DOCUMENTS

| | | |
|---|---|---|
| JP | 2007-109701 A | 4/2007 |
| JP | 2011-009298 A | 1/2011 |

\* cited by examiner

*Primary Examiner* — Selim Ahmed
*Assistant Examiner* — Changhyun Yi
(74) *Attorney, Agent, or Firm* — McGinn IP Law Group, PLLC

(57) ABSTRACT

A light-emitting device includes a thermally conductive substrate, a wiring electrode formed on the thermally conductive substrate, a resist formed on the wiring electrode except a terminal thereof, and a light-emitting element that is disposed in an element mounting region of the thermally conductive substrate and electrically connected to the terminal of the wiring electrode. A heat dissipation hole is formed in a region of the resist outside the element mounting region so as to expose a surface of the thermally conductive substrate.

17 Claims, 3 Drawing Sheets

LIGHT-EMITTING DEVICE INCLUDING A HEAT DISSIPATION HOLE

The present application is based on Japanese patent application No. 2013-062488 filed on Mar. 25, 2013, the entire contents of which are incorporated herein by reference.

BACKGROUND OF THE INVENTION

1. Field of the Invention

The invention relates to a light-emitting device.

2. Related Art

A light-emitting device is known that a light-emitting element is mounted on a metal plate to which a wiring board is bonded via an adhesive layer (See e.g., JP-A-2007-109701). The light-emitting device disclosed in JP-A-2007-109701 is excellent in heat dissipation properties since a metal plate with a high thermal conductivity is used as a light-emitting element mounting substrate.

SUMMARY OF THE INVENTION

The light-emitting device disclosed in JP-A-2007-109701 is constructed such that the metal plate with the high thermal conductivity is mostly exposed on the back side of the light-emitting device so as to facilitate the heat dissipation. However, since the most part of the metal plate on the front side is not exposed, it is not possible to achieve the efficient heat dissipation.

It is an object of the invention to provide a light-emitting device that facilitates the efficient heat dissipation from the front and back sides of the substrate.

(1) According to one embodiment of the invention, a light-emitting device comprises:

a thermally conductive substrate;

a wiring electrode formed on the thermally conductive substrate;

a resist formed on the wiring electrode except a terminal thereof; and a light-emitting element that is disposed in an element mounting region of the thermally conductive substrate and electrically connected to the terminal of the wiring electrode, wherein a heat dissipation hole is formed in a region of the resist outside the element mounting region so as to expose a surface of the thermally conductive substrate.

In the above embodiment (1) of the invention, the following modifications and changes can be made.

(i) The thermally conductive substrate comprises an aluminum substrate or an aluminum alloy substrate and an anodic oxide film formed on the exposed surface thereof outside the element mounting region.

(ii) The anodic oxide film comprises a black surface.

(iii) The surface of the thermally conductive substrate is exposed inside the element mounting region, and wherein the light-emitting element is disposed directly on the thermally conductive substrate.

(iv) The thermally conductive substrate comprises an anodic oxide film formed on the exposed surface thereof inside the element mounting region.

(v) The anodic oxide film comprises a white surface.

(vi) The exposed surface of the thermally conductive substrate is roughened.

Effects of the Invention

According to one embodiment of the invention, a light-emitting device can be provided that facilitates the efficient heat dissipation from the front and back sides of the substrate.

BRIEF DESCRIPTION OF THE DRAWINGS

Next, the present invention will be explained in more detail in conjunction with appended drawings, wherein.

DESCRIPTION OF THE PREFERRED EMBODIMENTS

First Embodiment

Figure 1:
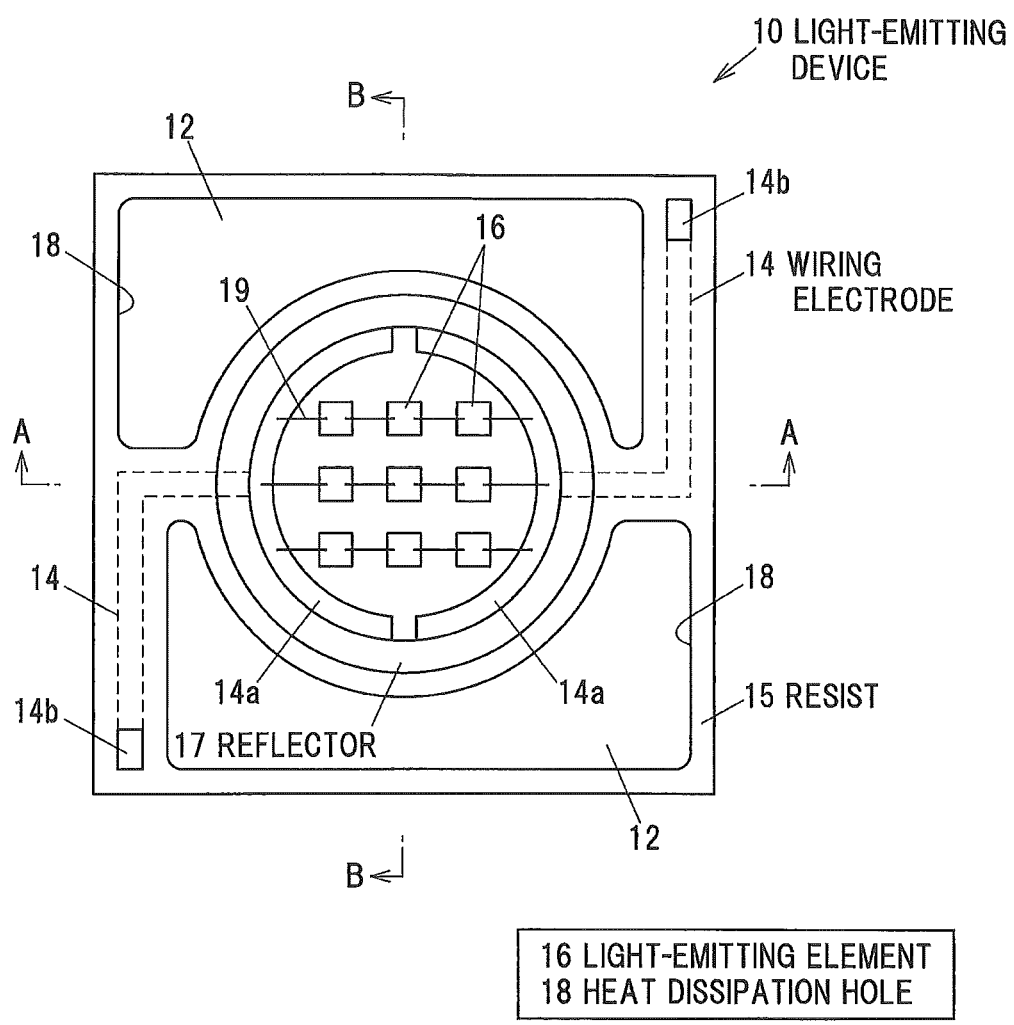
FIG. 1 is a top view showing a light-emitting device in a first embodiment.
Figure 2A:
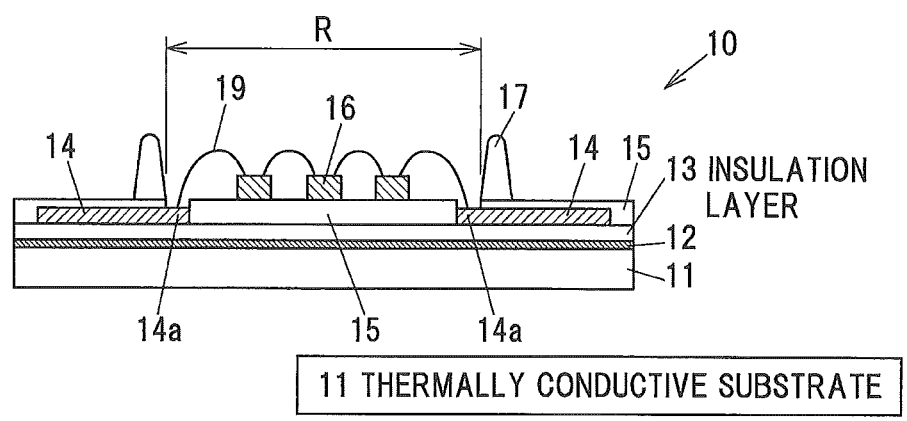
FIGS. 2A and 2B are vertical cross-sectional views showing the light-emitting device respectively taken along lines A-A and B-B, respectively, in FIG. 1.
Figure 2B:
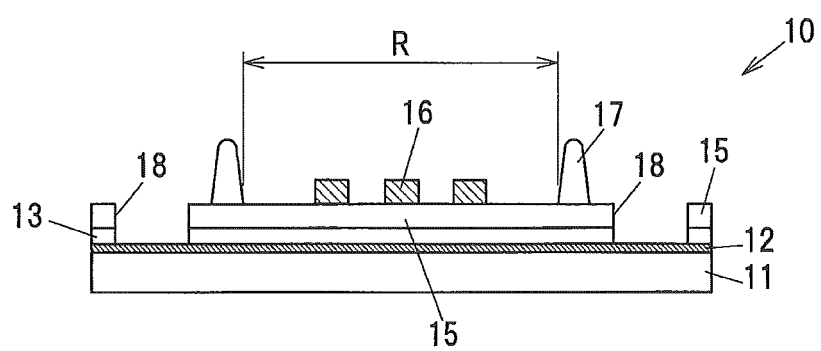

FIG. 1 is a top view showing a light-emitting device 10 in the first embodiment. FIGS. 2A and 2B are vertical cross-sectional views showing the light-emitting device 10 respectively taken on lines A-A and B-B of FIG. 1.

The light-emitting device 10 has a thermally conductive substrate 11, a wiring electrode 14 formed on the thermally conductive substrate 11, a resist 15 covering the wiring electrode 14 except terminals 14a and 14b, light-emitting elements 16 placed on the resist 15 in an element mounting region R of the thermally conductive substrate 11 and electrically connected to the terminal 14a of the wiring electrode 14, and a reflector 17 surrounding the element mounting region R. Heat dissipation holes 18 exposing a surface of the thermally conductive substrate 11 are provided on the resist 15 in a region outside of the element mounting region R.

The thermally conductive substrate 11 is a substrate having high thermal conductivity and is, e.g., an aluminum substrate, an aluminum alloy substrate, an aluminum nitride substrate or a glass-epoxy substrate. When a glass-epoxy substrate is used, it is preferable that a high thermal conductive material such as AlN, BN, Si or GaN be contained as a filler.

When the thermally conductive substrate 11 is an aluminum substrate or an aluminum alloy substrate, it is possible to improve heat dissipation properties of the thermally conductive substrate 11 by forming an anodic oxide film 12, which is an aluminum anodic oxide film, on the surface of the thermally conductive substrate 11 as shown in FIGS. 1, 2A and 2B. In this case, the anodic oxide film 12 is formed on the thermally conductive substrate 11 at least in a region exposed from the heat dissipation hole 18.

In addition, the anodic oxide film 12 may be colored. When using, e.g., a black anodic oxide film, it is possible to dissipate heat from the heat dissipation hole 18 more effectively.

In addition, the surface of the thermally conductive substrate 11 may be roughened by sandblasting, etc. Since the surface area is increased by surface roughening, it is possible to improve heat dissipation properties of the thermally conductive substrate 11. The surface of the thermally conductive substrate 11 is roughened at least in a region exposed from the heat dissipation hole 18. When the entire surface of the thermally conductive substrate 11 is roughened, an anchor effect improves adhesion between the thermally conductive substrate 11 and an insulation layer 13. In case that the anodic oxide film 12 is formed, anodization is performed after the surface roughening.

The wiring electrode 14 is formed on the thermally conductive substrate 11 via the insulation layer 13. The wiring electrode 14 is formed of, e.g., a Cu/Au laminated film. The insulation layer 13 is formed of an insulating material such as glass epoxy or polyimide.

The resist 15 is formed of, e.g., a resin material such as silicone-based resin or epoxy-based resin. By covering the wiring electrode 14 with the resist 15, it is possible to isolate the wiring electrode 14 except the terminals 14a and 14b from the outside and to suppress corrosion due to humidity or oxidation of the wiring electrode 14.

The light-emitting element 16 is, e.g., an LED chip and is placed in the element mounting region R of the thermally conductive substrate 11. In the configuration shown in FIGS. 1, 2A and 2B, the element mounting region R is a region surrounded by the reflector 17. The light-emitting element 16 is electrically connected to the terminal 14a of the wiring electrode 14 by a bonding wire 19. An external power source is connected to the terminal 14b of the wiring electrode 14 and power is supplied to the light-emitting element 16 via the wiring electrode 14.

Note that, the number and arrangement of the light-emitting elements 16 and the shape of the wiring electrode 14, etc., are not limited to those shown in FIGS. 1, 2A and 2B. For examples, the light-emitting element 16 may be connected to the wiring electrode 14 by conductive bumps, etc.

The reflector 17 is an annular member surrounding the element mounting region R and is formed of, e.g., a thermoplastic resin such as polyphthalamide resin, LCP (Liquid Crystal Polymer) or PCT (Polycyclohexylene Dimethylene Terephthalate) or a thermosetting resin such as silicone resin, modified silicone resin, epoxy resin or modified epoxy resin. The reflector 17 may contain light-reflecting particles of titanium dioxide, etc., to improve light reflectance.

The heat dissipation hole 18 exposing the surface of the thermally conductive substrate 11 is provided on the resist 15 and on the insulation layer 13. The heat dissipation hole 18 is formed outside of the element mounting region R. When the reflector 17 is formed around the light-emitting elements 16 as shown in FIGS. 1, 2A and 2B, the heat dissipation hole 18 is formed on the outer side of the reflector 17. In addition, it is preferable that the heat dissipation hole 18 be not formed at the edge of the light-emitting device 10 so that insulation at the edge of the light-emitting device 10 is ensured.

Second Embodiment

The second embodiment is different from the first embodiment in that the light-emitting elements are placed directly on the thermally conductive substrate. Note that, the explanation for the same features as the first embodiment will be omitted or simplified.

Figure 3A:
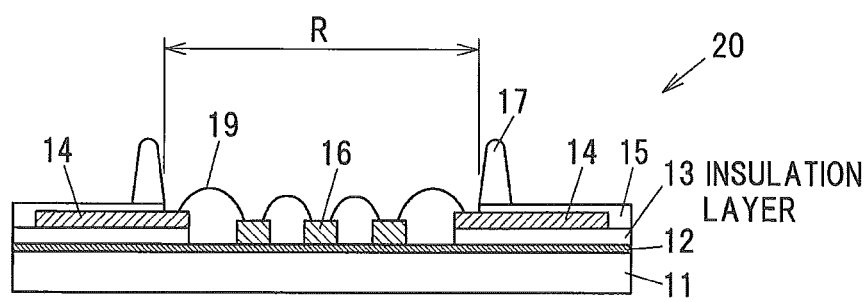
FIGS. 3A and 3B are vertical cross-sectional views showing a light-emitting device in a second embodiment.
Figure 3B:
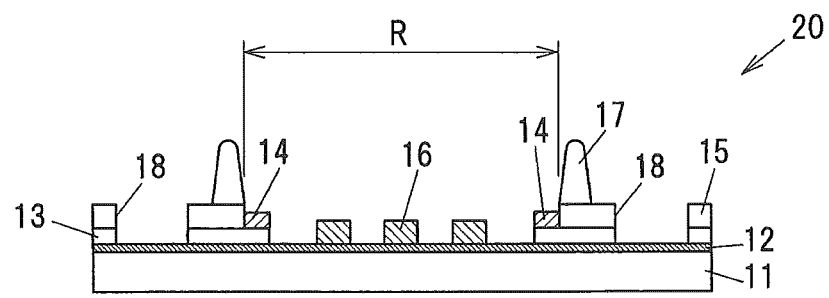

FIGS. 3A and 3B are vertical cross-sectional views showing a light-emitting device 20 in the second embodiment. The cross sections shown in FIGS. 3A and 3B respectively correspond to those shown in FIGS. 2A and 2B.

The light-emitting device 20 has the thermally conductive substrate 11, the wiring electrode 14 formed on the thermally conductive substrate 11, the resist 15 covering the wiring electrode 14 except the terminals 14a and 14b, and the light-emitting elements 16 formed on the thermally conductive substrate 11 and electrically connected to the terminal 14a of the wiring electrode 14. The heat dissipation holes 18 exposing the surface of the thermally conductive substrate 11 are provided on the resist 15.

In the light-emitting device 20, the surface of the thermally conductive substrate 11 is exposed also in the element mounting region R of the thermally conductive substrate 11 and the light-emitting elements 16 are placed directly on the thermally conductive substrate 11. Heat generated in the light-emitting elements 16 can be effectively dissipated to the air from the exposed portion. In this regard, however, when the thermally conductive substrate 11 has electrical conductivity, the light-emitting element 16 needs to be a face-up type element of which element substrate having insulation properties faces downward.

When the thermally conductive substrate 11 is an aluminum substrate or an aluminum alloy substrate, it is possible to improve heat dissipation properties of the thermally conductive substrate 11 by forming the anodic oxide film 12, which is an aluminum anodic oxide film, on the surface of the thermally conductive substrate 11.

In this case, it is preferable that a black anodic oxide film 12 excellent in heat dissipation properties be formed in the region exposed from the heat dissipation hole 18 and a white anodic oxide film 12 excellent in light reflectance be formed in the region exposed in the element mounting region R.

Alternatively, the light-emitting element 16 may be placed on a multilayer reflection film (DBR film) formed on the thermally conductive substrate 11 in a region exposed in the element mounting region R. By forming the multilayer reflection film, it is possible to improve light reflectance of the surface of the thermally conductive substrate 11 exposed in the element mounting region R. When the thermally conductive substrate 11 has the anodic oxide film 12 on the surface thereof, light reflectance of the surface of the thermally conductive substrate 11 exposed in the element mounting region R can be improve by, e.g., forming the multilayer reflection film on the white anodic oxide film 12 having excellent light reflectance.

Effects of the Embodiment

The light-emitting device 10 in the first embodiment has excellent heat dissipation properties since heat generated in the light-emitting elements 16 can be dissipated not only from the back side of the thermally conductive substrate 11 toward the substrate or a heatsink immediately underneath but also from the front side to the air through the heat dissipation hole 18. In addition, in the light-emitting device 20 of the second embodiment, it is possible to effectively dissipate heat also from the exposed region of the thermally conductive substrate 11 around the light-emitting elements 16.

Although the embodiments of the invention have been described, the invention is not intended to be limited to the embodiments and the various kinds of modifications can be implemented without departing from the gist of the invention.

In addition, the invention according to claims is not to be limited to the above-mentioned embodiments. Further, please note that all combinations of the features described in the embodiments are not necessary to solve the problem of the invention.

What is claimed is:

1. A light-emitting device, comprising:
   a thermally conductive substrate;
   a wiring electrode formed on the thermally conductive substrate;
   a resist formed on the wiring electrode except a terminal thereof;

a light-emitting element that is disposed in an element mounting region of the thermally conductive substrate and electrically connected to the terminal of the wiring electrode; and a reflector disposed on the resist, wherein a heat dissipation hole is formed in a region of the resist outside the element mounting region so as to expose a surface of the thermally conductive substrate, and wherein the heat dissipation hole is formed on an outer side of the reflector.

2. The light-emitting device according to claim 1, wherein the thermally conductive substrate comprises an aluminum substrate or an aluminum alloy substrate and an anodic oxide film formed on the exposed surface thereof outside the element mounting region.

3. The light-emitting device according to claim 2, wherein the anodic oxide film comprises a black surface.

4. The light-emitting device according to claim 1, wherein the surface of the thermally conductive substrate is exposed inside the element mounting region, and wherein the light-emitting element is disposed directly on the thermally conductive substrate.

5. The light-emitting device according to claim 4, wherein the thermally conductive substrate comprises an anodic oxide film formed on the exposed surface thereof inside the element mounting region.

6. The light-emitting device according to claim 5, wherein the anodic oxide film comprises a white surface.

7. The light-emitting device according to claim 1, wherein the exposed surface of the thermally conductive substrate is roughened.

8. The light-emitting device according to claim 1, wherein the surface of the thermally conductive substrate is roughened at least in a region exposed from the heat dissipation hole.

9. The light-emitting device according to claim 1, wherein an entirety of the surface of the thermally conductive substrate is roughened.

10. The light-emitting device according to claim 5, wherein the anodic oxide film comprises a black surface.

11. The light-emitting device according to claim 1, wherein the element mounting region is surrounded by the reflector.

12. The light-emitting device according to claim 1, wherein the resist surrounds an entirety of the heat dissipation hole.

13. The light-emitting device according to claim 1, further comprising an insulation layer, wherein the wiring electrode is formed on the thermally conductive substrate via the insulation layer.

14. The light-emitting device according to claim 1, wherein said reflector comprises a reflective annular member surrounding the element mounting region.

15. The light-emitting device according to claim 1, further comprising an insulation layer disposed on the thermally conductive substrate.

16. The light-emitting device according to claim 1, further comprising a region between the heat dissipation hole and an edge of the resist.

17. A light-emitting device, comprising:

a thermally conductive substrate;

a wiring electrode formed on the thermally conductive substrate;

a resist formed on the wiring electrode except a terminal thereof;

an insulation layer disposed on the thermally conductive layer;

a light-emitting element that is disposed in an element mounting region of the thermally conductive substrate and electrically connected to the terminal of the wiring electrode; and a reflector disposed on the resist, wherein a heat dissipation hole is formed in a region of the resist and the insulation layer outside the element mounting region to expose a surface of the thermally conductive substrate, and wherein the heat dissipation hole is formed on an outer side of the reflector.

* * * * *